(12) United States Patent
Zhang et al.

(10) Patent No.: US 9,401,310 B2
(45) Date of Patent: Jul. 26, 2016

(54) METHOD TO FORM TRENCH STRUCTURE FOR REPLACEMENT CHANNEL GROWTH

(71) Applicant: Applied Materials, Inc., Santa Clara, CA (US)

(72) Inventors: Ying Zhang, Santa Clara, CA (US); Hua Chung, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 42 days.

(21) Appl. No.: 14/170,887

(22) Filed: Feb. 3, 2014

(65) Prior Publication Data

US 2015/0221556 A1    Aug. 6, 2015

(51) Int. Cl.
*H01L 21/8234* (2006.01)
*H01L 21/033* (2006.01)
*H01L 21/311* (2006.01)

(52) U.S. Cl.
CPC .... *H01L 21/823431* (2013.01); *H01L 21/0334* (2013.01); *H01L 21/0337* (2013.01); *H01L 21/31144* (2013.01)

(58) Field of Classification Search
None
See application file for complete search history.

(56) References Cited

U.S. PATENT DOCUMENTS

| | | | |
|---|---|---|---|
| 2013/0196508 A1* | 8/2013 | LiCausi | 438/696 |
| 2014/0213037 A1* | 7/2014 | LiCausi et al. | 438/429 |
| 2015/0056724 A1* | 2/2015 | Shieh et al. | 438/14 |

* cited by examiner

*Primary Examiner* — Charles Garber
*Assistant Examiner* — Brigitte Paterson
(74) *Attorney, Agent, or Firm* — Kilpatrick Townsend & Stockton LLP

(57) ABSTRACT

Embodiments may include a method of semiconductor patterning including forming a first trench bordered by a first spacer material. The method may involve forming a second trench bordered by a second spacer material formed conformally around the first spacer material. The method may include filling the second trench with a semiconductor material.

20 Claims, 10 Drawing Sheets

METHOD TO FORM TRENCH STRUCTURE FOR REPLACEMENT CHANNEL GROWTH

FIELD

Embodiments of the present invention relate to forming semiconductor fins.

BACKGROUND

Integrated circuits are made possible by processes which produce intricately patterned material layers on substrate surfaces. Producing patterned material on a substrate requires controlled methods for removal of exposed material. Chemical etching is used for a variety of purposes including transferring a pattern in photoresist into underlying layers, thinning layers, or thinning lateral dimensions of features already present on the surface. Often it is desirable to have an etch process that etches one material faster than another facilitating, for example, a pattern transfer process. Such an etch process is said to be selective to the first material. As a result of the diversity of materials, circuits, and processes, etch processes have been developed with a selectivity toward a variety of materials.

Etch processes may be termed wet or dry based on the materials used in the process. A wet HF etch preferentially removes silicon oxide over other dielectrics and materials. However, wet processes may have difficulty penetrating some constrained trenches and also may sometimes deform the remaining material. Dry etches produced in local plasmas formed within the substrate processing region can penetrate more constrained trenches and exhibit less deformation of delicate remaining structures. However, local plasmas may damage the substrate through the production of electric arcs as they discharge or if a high enough selectivity is not achievable.

Thus, there is a need for improved systems and methods that can be used to produce high quality devices and structures. These and other needs are addressed by the present technology.

SUMMARY

To increase the density of transistors in microprocessors, semiconductor technology has incorporated fin-shaped features as part of the transistor. These fins may form the source, drain, and/or the channel of a transistor and may have the advantage of taking up a smaller area than a conventional field-effect transistor. The dimensions of the fin may be important for transistor performance and reliability. The width of the fin may affect the electrical properties of the transistor, including the threshold voltage and series resistance. The height of the fin also may affect the electrical properties of the transistor, including the drive current and the gate capacitance. Thus, control of the dimensions of the fin may be important to transistor performance.

Embodiments may include a method of semiconductor patterning including forming a first trench bordered by a first spacer material. The method may involve forming a second trench bordered by a second spacer material formed conformally around the first spacer material. The method may include filling the second trench with a semiconductor material.

Embodiments may include a method of semiconductor patterning, which may include forming a spacer material layer conformally around a feature comprising a hardmask material to define a trench. The method may involve removing substantially all of the feature and may include filling a portion of the trench with a semiconductor material.

Embodiments of the technology may involve a semiconductor patterning method, which includes forming hardmask features on a semiconductor substrate. The method may include forming a first pair of trenches bordered by a first spacer material formed conformally around the hardmask features. The method may involve forming a second pair of trenches bordered by a second spacer material formed conformally around the first spacer material, where the first spacer material differs from the second spacer material. The method may include removing substantially all of the first spacer material. The method may incorporate filling the second pair of trenches with a semiconductor material and forming a pair of fin structures composed of the semiconductor material in the second pair of trenches. The pair of fin structures may have a pitch of less than 22.5 nm and may be formed above a first section of a top surface of the semiconductor substrate. The second spacer material may be above a second section of the top surface of the semiconductor substrate. The first section of the top surface of the semiconductor substrate may be substantially coplanar with the second section of the top surface of the semiconductor substrate. The method may include leaving a portion of the second spacer material in a completed semiconductor device.

Embodiments of the present technology may provide improvements in controlling the width and height of fins in transistors. A narrower fin with a more uniform width may be produced as a result of the processing technology. The fin width may be more uniform along the height of the fin or may be more uniform along the fin's longitudinal axis. The shape of the fin may be more rectangular as a result of embodiments of the present technology. The fin may be substantially vertical, and material between adjacent fins may also be substantially vertical. Dielectric or other material between adjacent fins may also be essentially free of voids or poor contact with the fins. Substrate surfaces that are flatter may result from the technology. The fins may be patterned at narrower widths and pitches while achieving favorable device performance. These characteristics and other characteristics of the present technology may lead to better performing and more reliable transistors. Embodiments of the present technology provide these and additional benefits.

DESCRIPTION OF THE DRAWINGS

A further understanding of the nature and advantages of the disclosed technology may be realized by reference to the remaining portions of the specification and the drawings.

DETAILED DESCRIPTION

Semiconductor patterning may involve patterning an upper layer along with an underlying layer. Semiconductor processing technology may also remove at least a portion of the upper layer while retaining the underlying layer. Conventional semiconductor processing technology may remove at least some of the upper layer but may still affect the underlying layer. The underlying layer may itself be etched partially away, changing the initially patterned profile. Furthermore, the removal of the upper layer may also deposit contaminants on the underlying layer or affect the structural, electrical, or other properties of the underlying layer. Conventional processing may also require additional processing operations or equipment. These methods may detrimentally degrade the performance of the semiconductor device.

Semiconductor device designs may call for fins with substantially vertical and substantially rectangular cross sections. However, conventional processing may produce fins that have sloped rather than vertical sidewalls, possibly leading to a fin with a wider base than desired. In addition, conventional processing may result in etching or otherwise changing the shape of the top of the fin when attempting to change the angle of the sloped sidewall. Such processing may also leave a polymer residue on fins. Conventional processing with fins may include a concave surface between adjacent fins. This concave surface, which may be an oxide recess, may adversely affect device performance and subsequent processing steps. Conventional processing may include etching the semiconductor substrate, which may be the wafer itself, to form fins. The space between adjacent fins may be filled with a dielectric or other material by chemical vapor deposition (CVD). As the space between adjacent fins may be narrow, a deposition technique such as flowable CVD may be used to fill such narrow trenches. Dielectric material deposited by flowable CVD or other techniques may go through a thermal treatment. As the fins may be narrow and tall, the fins may have weak structural integrity. Thermal treatment of dielectric material near the fins may cause the dielectric material to shrink, which may then bend or tilt the fins. Embodiments of the present technology may provide improvements in fin patterning technology.

Figure 1A:
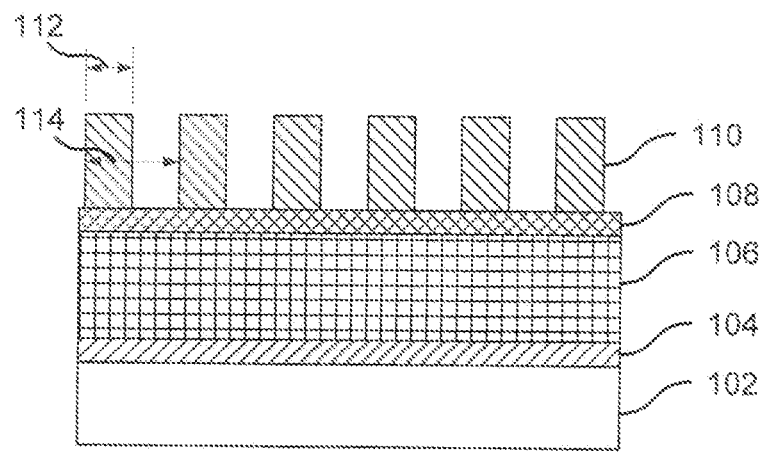
FIGS. 1A-1K show cross sections of a semiconductor substrate and other layers according to embodiments of the present technology.

As shown in FIG. 1A, embodiments of the present technology may include a semiconductor substrate 102 under layers of oxide (e.g., pad ox) 104, hardmask 106, dielectric anti-reflection coating ("DARC") or oxide 108, and a photoresist feature 110. The photoresist feature 110 may be patterned by 193 nm immersion lithography. The photoresist feature 110 may have a width 112 of about 45 nm and a pitch 114 of about 90 nm. The pitch may be the distance from any point on a first photoresist feature to a corresponding point on an adjacent second photoresist feature.

The semiconductor substrate 102 may be a silicon wafer or it may comprise a silicon wafer and a buffer layer in embodiments. In some embodiments, the buffer layer may comprise a III-V compound, and the buffer layer may be formed on top of the silicon wafer. Near the interface of the buffer layer and silicon wafer, the buffer layer may have dislocations possibly as a result of crystal mismatch between the silicon wafer and the buffer layer. The dislocations at the interface may be at a density of about $10^{11}$ cm$^{-2}$ or $10^{12}$ cm$^{-2}$. At the top of the buffer layer, the dislocation density may be less than the density at the interface with the silicon wafer. In some embodiments, the top of the buffer layer may have dislocations at a density of $10^8$ cm$^{-2}$ or lower. In these or other embodiments, the top of the buffer layer may have a dislocation density of $10^4$ cm$^{-2}$ or lower. The lower dislocation density at the top of the buffer layer may allow for growth of a semiconductor material on top of the buffer layer with fewer dislocations.

Figure 1B:
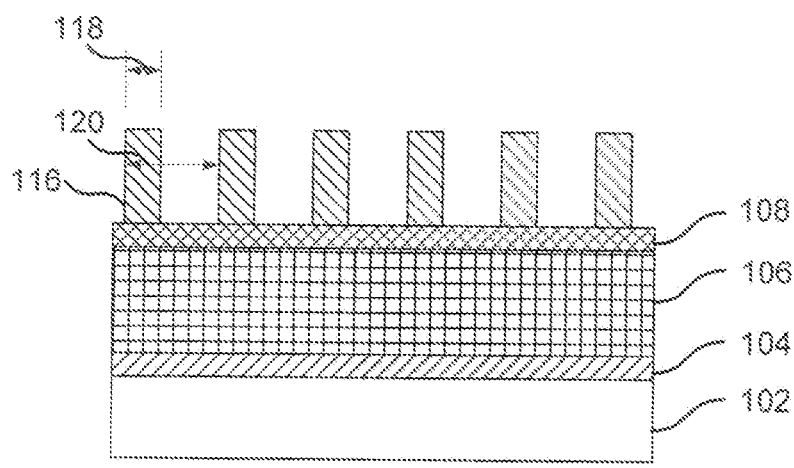

Turning to FIG. 1B, the photoresist feature 116 may be trimmed to reduce the width 118. For example, the width 118 of the photoresist feature may be 35 nm, while the pitch 120 may remain at about 90 nm.

Figure 1C:
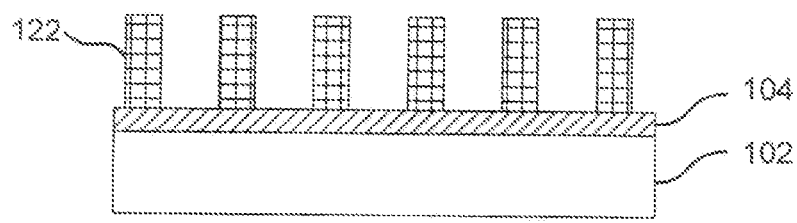

The hardmask may be etched to form the hardmask feature 122 in FIG. 1C. The hardmask feature 122 may have substantially the same width as the photoresist feature 116 in FIG. 1B. For example, the width of the hardmask feature may be about 35 nm. The height of the hardmask feature may be between 50 and 200 nm.

Figure 1D:
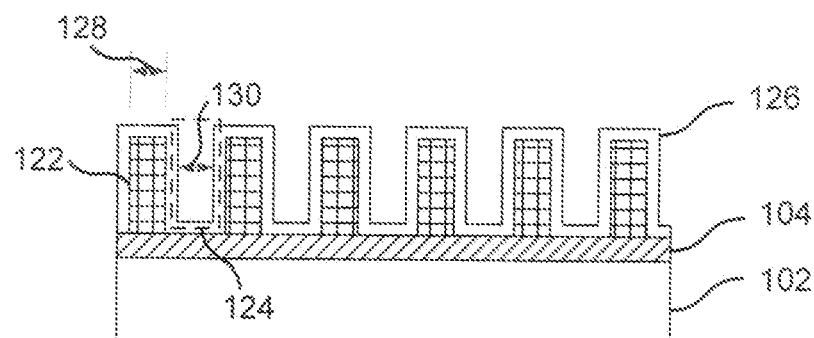

As shown in FIG. 1D, embodiments of the present technology may include a method of semiconductor patterning that may include forming a first trench 124 bordered by a first spacer material 126. The first spacer material 126 may be formed conformally around a hardmask feature 122. The first spacer material 126 may be silicon nitride or silicon oxide. The first spacer material 126 may be deposited by CVD or atomic layer deposition (ALD). The hardmask feature may have a first width 128, and the first trench 124 may have a second width 130. The first width 128 may be essentially equal to the second width 130. For example, both the first width 128 and the second width 130 may be about 35 nm. The width of the first spacer material may be about 10 nm.

Figure 1E:
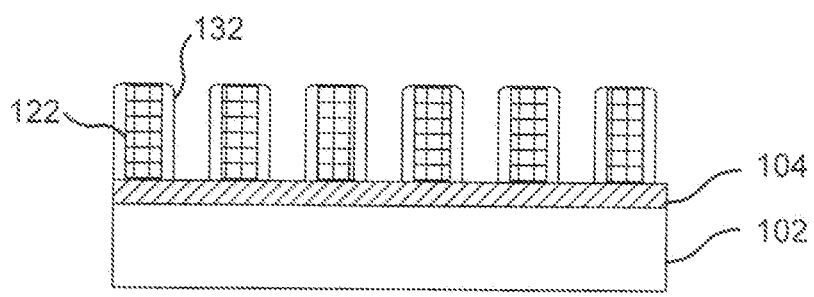

Turning to FIG. 1E, the first spacer material 132 may be etched to remove substantially all the first spacer material above the hardmask feature 122. The first spacer material forming the bottom of the first trench 124 may be removed to expose part of the oxide 104. The first spacer material may be etched by a fluorocarbon-based chemistry.

Figure 1F:
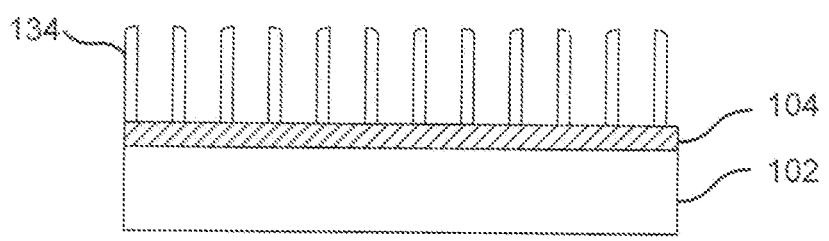

As shown in FIG. 1F, the hardmask feature may be substantially all removed. The hardmask may be stripped by an oxygen-based chemistry. First spacer material 134 may remain after the hardmask is stripped.

Figure 1G:
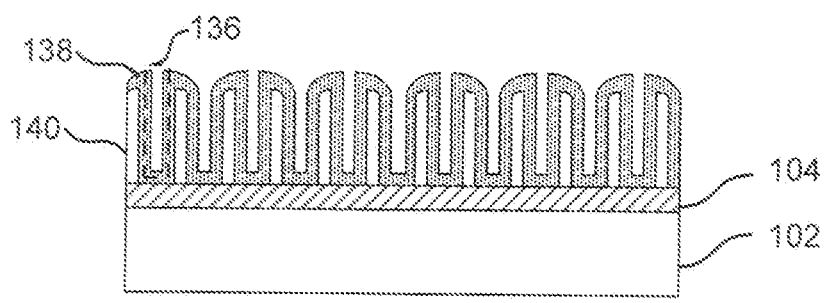

Turning to FIG. 1G, the method may involve forming a second trench 136 bordered by a second spacer material 138 formed conformally around the first spacer material 140. The second spacer material 138 may be silicon nitride or silicon oxide and may be deposited by CVD or ALD. The second trench 136 may have a width of less than or equal to about 10 nm, less than or equal to about 7 nm, or less than or equal to about 5 nm in embodiments. The second trench may have a height of greater than or equal to 150 nm, greater than or equal to 100 nm, or greater than or equal to 50 nm according to embodiments.

Figure 1H:
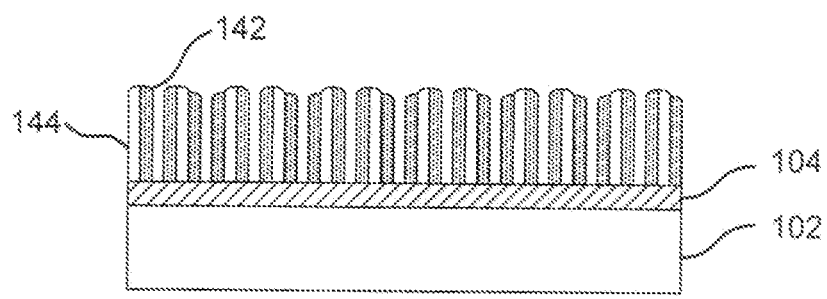

As shown in FIG. 1H, the second spacer material 142 may be etched to remove substantially all of the second spacer material 142 above the first spacer material 144. Additionally, the second spacer material forming the bottom of the second trench 136 may be removed to expose the oxide 104.

Figure 1I:
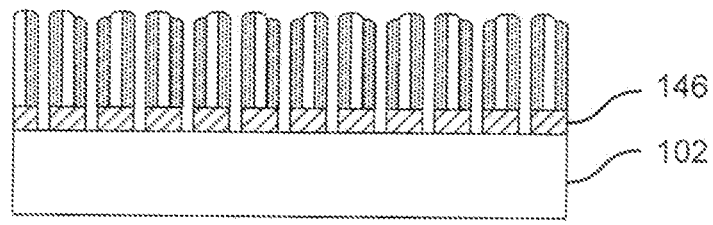

Turning to FIG. 1I, the oxide 146 may be etched to expose a portion of the semiconductor substrate 102.

Figure 1J:
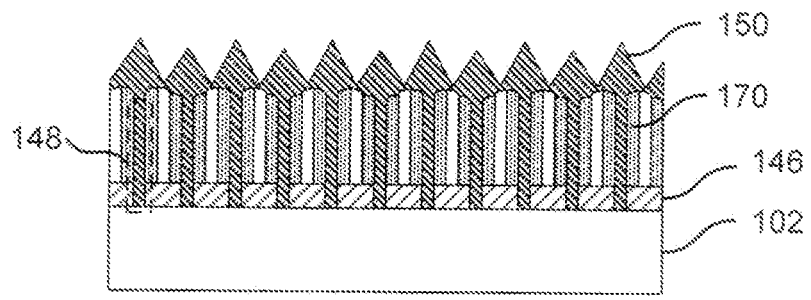

As shown in FIG. 1J, the method may incorporate filling the second trench 148 with a semiconductor material 150. The semiconductor material 150, which may be silicon, silicon germanium, germanium, or a III-V compound, may be grown epitaxially after forming the second trench.

Figure 1K:
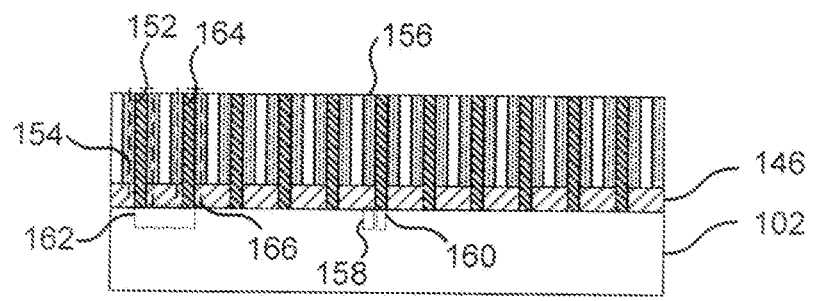

Turning to FIG. 1K, the method may involve forming a fin structure 152, with the fin structure 152 including the semiconductor material in the second trench 154. The fin structure 152 may be formed after a CMP (chemical mechanical planarization or chemical mechanical polishing) process to remove excess semiconductor material, along with some of the first and second spacer material. The fin structure 152 may have a width of less than or equal to about 10 nm, less than or equal to about 7 nm, or less than or equal to about 5 nm, according to embodiments.

The second spacer material 156 may be formed above a first section 158 of a top surface of a semiconductor substrate 102. Filling the second trench may include growing semiconductor material on a second section 160 of the top surface of the semiconductor substrate. The first section 158 may be substantially coplanar with the second section 160. A third section 162 of the top surface of the semiconductor substrate 102 between and under adjacent fin structures 152 and 164 may be essentially flat. The flat surface may be the result of not etching the semiconductor substrate 102 or uniformly etching the semiconductor substrate in the section 162 between and underneath the fin structures.

The method may include forming a pair of trenches 154 and 166 bordered by the second spacer. The pair of trenches 154 and 166 may have a pitch of less than or equal to about 45 nm, less than or equal to about 22.5 nm, or less than or equal to about 11.25 nm in embodiments. The pitch may be the distance from any point on the first trench 154 to a corresponding point on the adjacent second trench 166.

The pair of trenches 154 and 166 may be filled with the semiconductor material. A pair of fin structures 152 and 164 comprising the semiconductor material in the pair of trenches 154 and 166 may be formed. The pair of fin structures 152 and 164 may have a pitch of less than or equal to about 45 nm, less than or equal to about 22.5 nm, or less than or equal to about 11.25 nm in embodiments. The pitch may be the distance from any point on the first fin structure 152 to a corresponding point on the adjacent second fin structure 164. The pitch may be half the pitch of the photoresist features 110. The fin structure may have a height of greater than or equal to about 200 nm, greater than or equal to about 150 nm, greater than or equal to about 100 nm, or greater than or equal to about 50 nm according to embodiments.

With returning reference to FIG. 1J, a portion of the second spacer material 170 initially adjacent to the semiconductor material 150 may be removed by a CMP step and may be removed by a recess etch to expose the upper sidewall of the semiconductor material fin structure. A layer may be formed above the fin structure 152 in FIG. 1K. The layer may include material that acts as a transistor gate or as a dielectric. The layer may overlie second spacer material 156 adjacent to the semiconductor material, where the remaining second spacer material 156 constitutes more than two-thirds or more than one-half of the second spacer material initially adjacent to the semiconductor material in embodiments. The remaining second spacer material may have a height more than half the height of the fin structure. In these or other embodiments, the method may include leaving a portion of the second spacer material in a completed semiconductor device.

With returning reference to FIG. 1G, the method may further include forming a layer over the semiconductor material or a fin structure while retaining most of the first spacer material 140 initially adjacent to the second spacer material 138. The layer may include material that acts as a transistor gate or as a dielectric. A portion of the first spacer material initially adjacent to the second spacer material may be removed by CMP and may be removed by a recess etch to expose the upper sidewall of the semiconductor material fin structure. The height of the remaining first spacer material may be more than half of the height of the fin structure. The remaining portion of the first spacer material adjacent to the second spacer material may be more than two-thirds or more than one-half of the first spacer material initially adjacent to the second spacer material according to embodiments. In these or other embodiments, the method may include leaving a portion of the first spacer material in a completed semiconductor device. In embodiments, FIGS. 1A-1K may occur in the order listed. The figures may occur in other orders according to embodiments.

Figure 2:
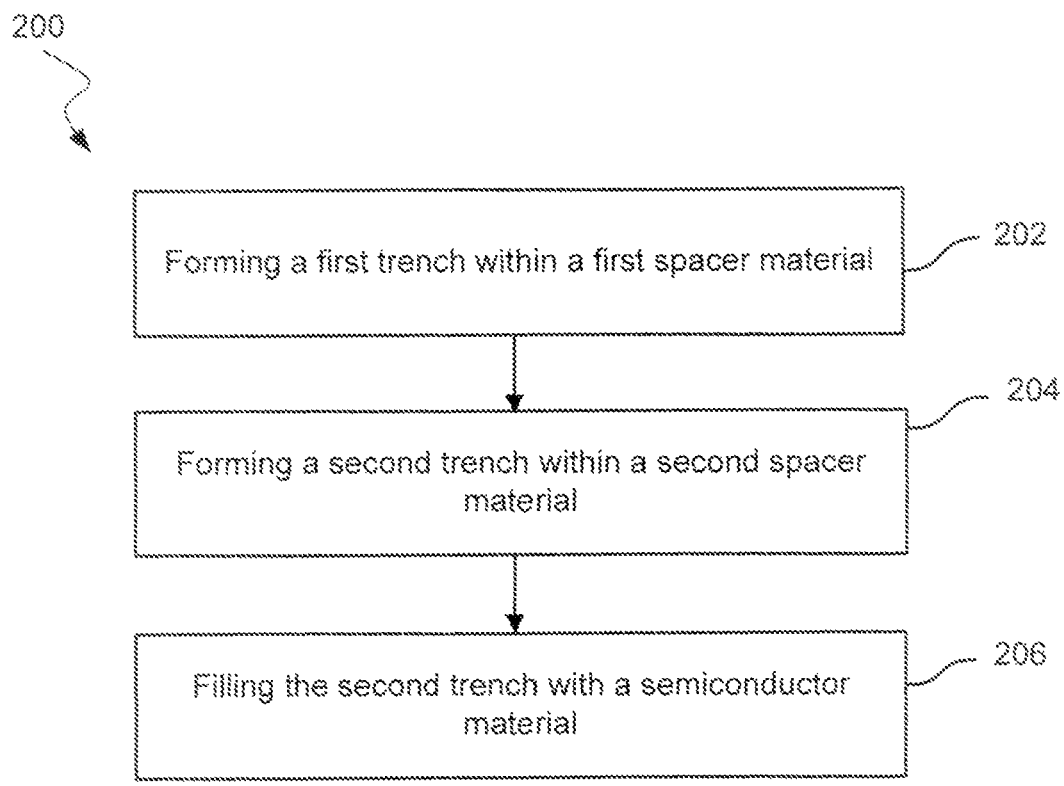
FIG. 2 shows a method of patterning a semiconductor substrate according to embodiments of the present technology.

Embodiments may include the method 200 shown in FIG. 2. The method may include forming a first trench within a first spacer material 202. The method may involve forming a second trench defined by a second spacer material 204 and may include filling the second trench with a semiconductor material 206.

Figure 3A:
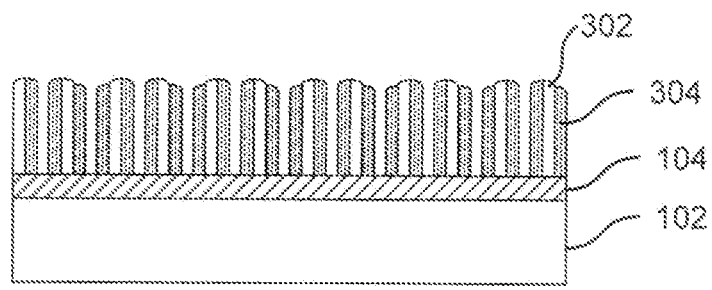
FIGS. 3A-3E show cross sections of a semiconductor substrate and other layers according to embodiments of the present technology.

Turning to FIG. 3A, the method may include a process where the first spacer material 302 may differ from the second spacer material 304. If the first spacer material 302 differs from second spacer material 304, the two materials may etch at different rates and an etch process may be selective to one material over the other.

Figure 3B:
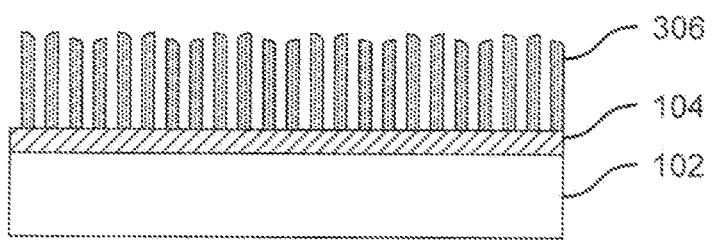
Figure 3C:
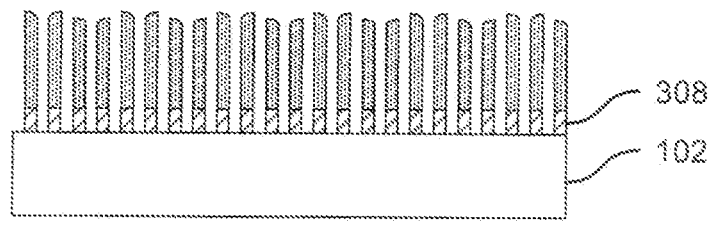
Figure 3D:
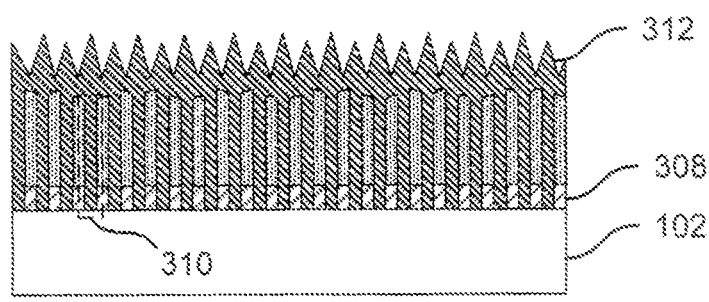

As shown in FIG. 3B, the first spacer material may be substantially all removed by an etch process, leaving second spacer material 306. The etch may be by a fluorocarbon-based chemistry. Turning to FIG. 3C, the oxide 308 may be etched to expose part of the surface of the semiconductor substrate 102. As shown in FIG. 3D, the method may include filling the trench 310 with a semiconductor material 312.

Figure 3E:
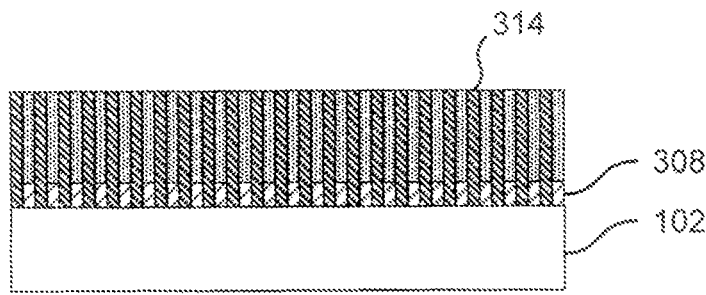

Turning to FIG. 3E, the method may involve forming a fin structure 314. The pitch of a plurality of fin structures may be less than or equal to about 22.5 nm or less than or equal to about 11.25 nm according to embodiments. Similarly, the pitch of a plurality of trenches comprising semiconductor material may be less than or equal to about 22.5 nm or less than or equal to about 11.25 nm in embodiments. The pitch may be about one-fourth of the pitch of the photoresist features. The sidewalls of the trenches may be formed by deposition rather than etching, possibly leading to more vertical fins. In embodiments, FIGS. 3A-3E may occur in the order listed. The figures may occur in other orders according to embodiments.

Figure 4A:
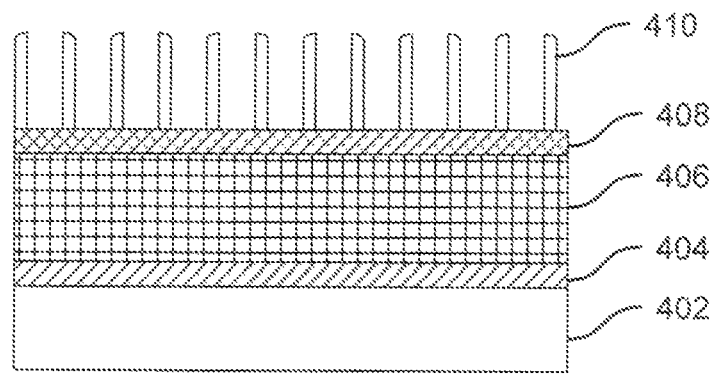
FIGS. 4A-4F show cross sections of a semiconductor substrate and other layers according to embodiments of the present technology.

Embodiments may include multiple layers of hardmask material and DARC/oxide. With returning reference to FIG. 1F, another layer of hardmask and DARC/oxide may be between first spacer material 134 and oxide 104. Such a cross section may be similar to the cross section shown in FIG. 4A. Spacer material 410 may lie above a layer of hardmask 406 and DARC/oxide 408. The hardmask 406 may lie above an oxide layer 404 and a semiconductor substrate 402.

Figure 4B:
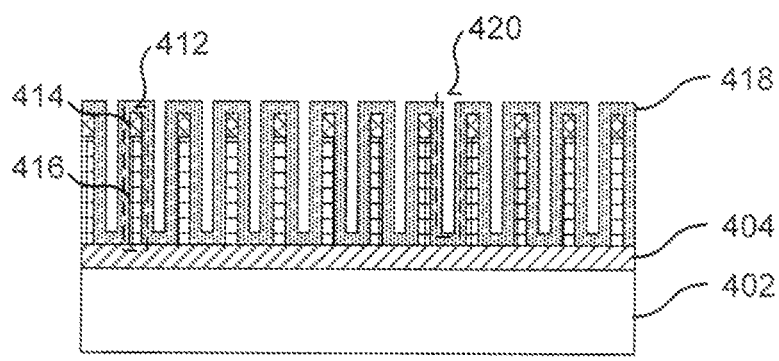

Turning to FIG. 4B, the DARC/oxide and the hardmask may be etched to form a feature 412 comprising of DARC/oxide 414 and hardmask 416, and a spacer material layer 418 may be formed conformally around the feature 412. The spacer material layer 418 around the hardmask feature 412 may define a trench 420. The trench 420 may have a width less than or equal to about 10 nm, less than or equal to about 7 nm, or less than or equal to about 5 nm in embodiments.

Figure 4C:
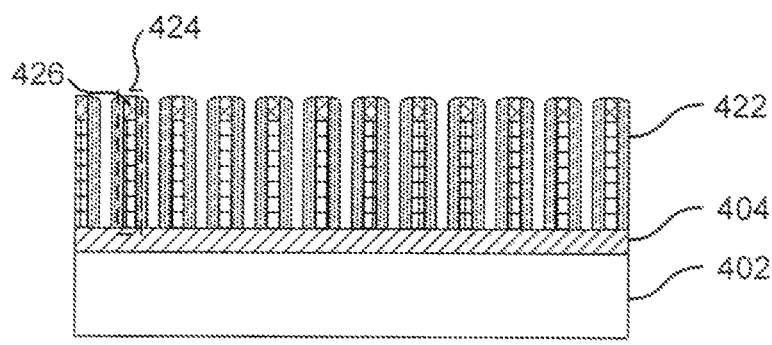
Figure 4D:
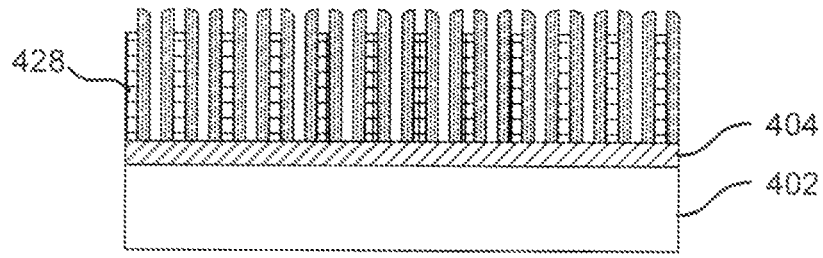

Turning to FIG. 4C, the method may encompass removing a portion of the spacer material layer 422 above the feature 424. The top of the feature may include DARC/oxide 426 as a cap. The spacer material may be etched away by a fluorocarbon-based chemistry. The DARC/oxide may be removed with a fluorocarbon chemistry, resulting in the cross section shown in FIG. 4D. The feature 428 may contain mostly hardmask material.

Figure 4E:
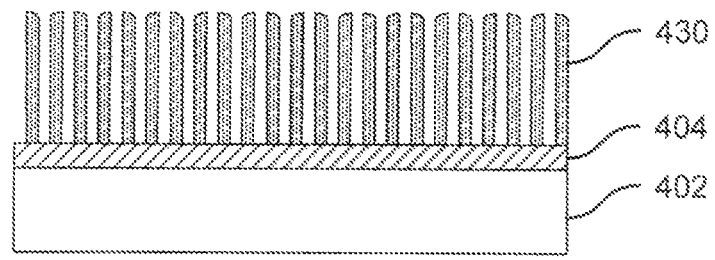

As shown in FIG. 4E, the method may involve removing substantially all of the feature. The hardmask material in the feature may be stripped by an $O_2$-based chemistry. With the feature removed, the spacer material 430 remains above the oxide layer 404.

The oxide layer 404 may be etched, and the method may include filling a portion of the trench with a semiconductor material, which may include silicon, germanium, silicon germanium, or a III-V compound. The semiconductor material may be grown by epitaxy. The method may include a CMP process to remove excess channel material.

Figure 4F:
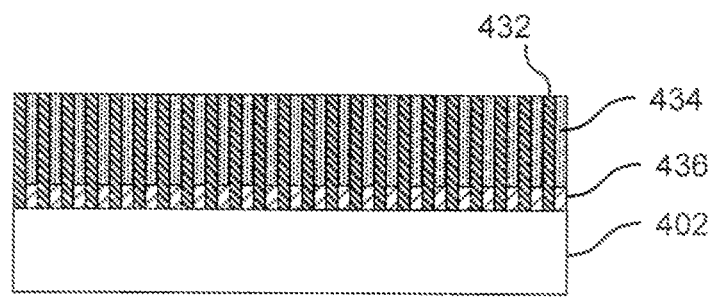

Turning to FIG. 4F, the method may involve forming a fin structure 432 composed of the semiconductor material in the trench. The fin structure 432 may have a width of less than or equal to about 10 nm, less than or equal to about 7 nm, or less than or equal to about 5 nm according to embodiments. A layer may be formed above the semiconductor material or the fin structure 432 while retaining most of the spacer material layer 434 initially adjacent to the semiconductor material. The spacer material layer 434 may remain to form most, substantially all, or all of the material between adjacent fin structures and may lie above oxide 436 according to embodiments. In these or other embodiments, the method may include leaving a portion of the spacer material layer 434 in a completed semiconductor device. In embodiments, FIGS. 4A-4F may occur in the order in which they appear. The figures may occur in other orders according to embodiments.

The method may include forming a plurality of trenches defined by the spacer material layer. The method may involve filling the plurality of trenches with the semiconductor material and forming a plurality of fin structures in the plurality of trenches. The plurality of trenches, and likewise the plurality of fin structures, may have a pitch of less than or equal to about 45 nm, less than or equal to about 22.5 nm, or less than or equal to about 11.5 nm in embodiments. The pitch of the plurality of fin structures may be equal to about one-fourth of the pitch of the photoresist features. Additional layers of hardmask material may result in decreasing the pitch by factors of 2, when compared to the pitch of the photoresist features. For example, a third layer of hardmask may result in a pitch that would be one-eighth of the pitch of the photoresist features used to pattern the uppermost hardmask layer. A fourth layer of hardmask may result in a pitch that would be one-sixteenth of the pitch of the photoresist features. Additionally, multiple hardmask layers may be used in combination with the multiple spacer material layers of FIGS. 1A-1K or FIGS. 3A-3E to achieve smaller pitches.

Each fin structure of the plurality of fin structures may be substantially vertical. Fin structure may not bend, tilt, or lean toward dielectric material. The plurality of fin structures may include two, three, four, or more fin structures in embodiments.

Figure 5:
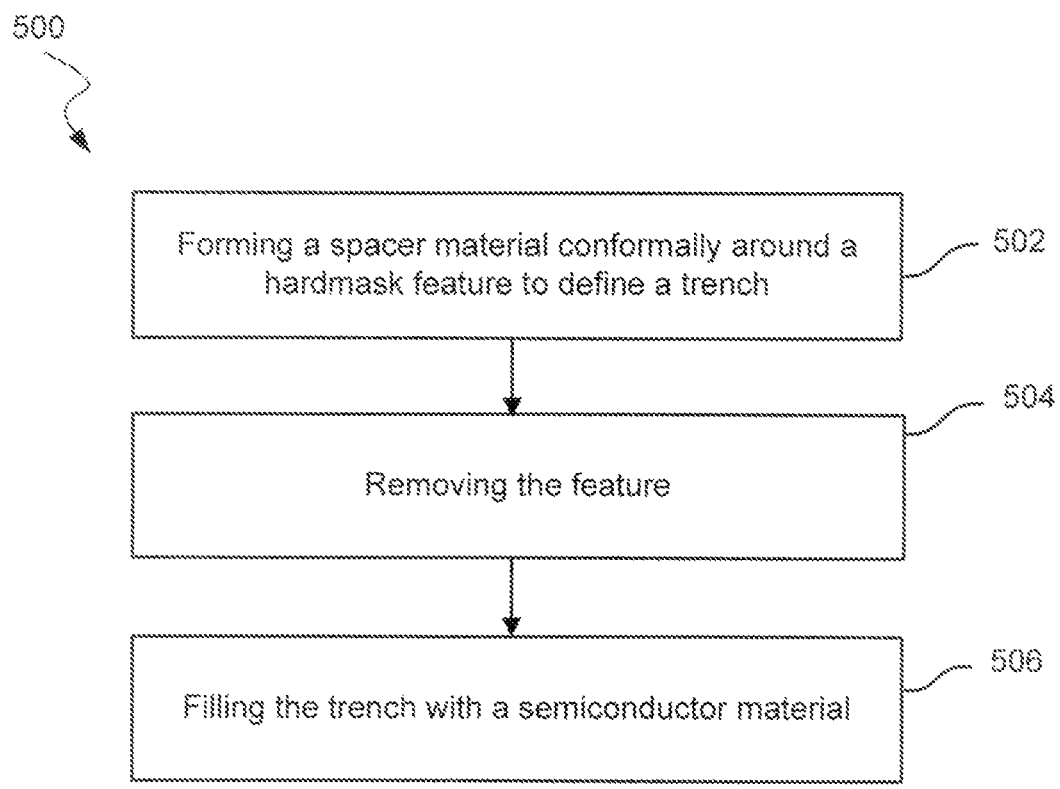
FIG. 5 shows a method of patterning a semiconductor substrate according to embodiments of the present technology.

As shown in FIG. 5, embodiments of the present technology may include a method 500 of semiconductor patterning, which may encompass forming a spacer material conformally around a feature comprising a hardmask material to define a trench 502. The method 500 may involve removing substantially all of the feature 504. The method 500 may incorporate filling a portion of the trench with a semiconductor material 506.

Figure 6:
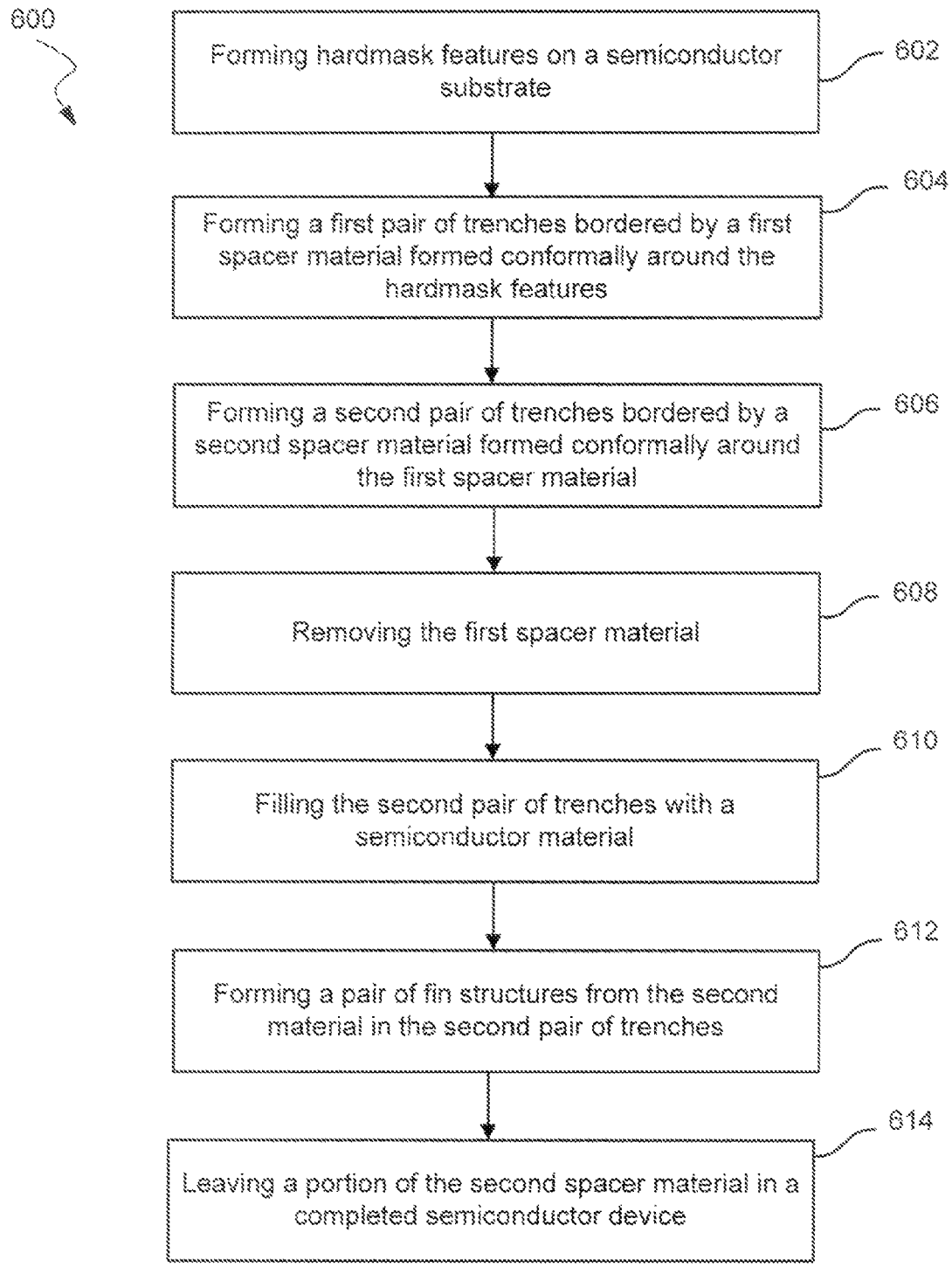
FIG. 6 shows a method of patterning a semiconductor substrate according to embodiments of the present technology.

As shown in FIG. 6, embodiments of the present technology may include a method 600 of semiconductor patterning, which involves forming hardmask features on a semiconductor substrate 602. The method 600 may include forming a first pair of trenches bordered by a first spacer material formed conformally around the hardmask features 604.

The method 600 may involve forming a second pair of trenches bordered by a second spacer material formed conformally around the first spacer material 606. The first spacer material may differ from the second spacer material. The method 600 may incorporate removing substantially all of the first spacer material 608.

The method 600 may involve filling the second pair of trenches with a semiconductor material 610. In addition, the method 600 may include forming a pair of fin structures, where the fin structures are composed of the semiconductor material in the second pair of trenches 612. The pair of fin structures may have a pitch of less than about 45 nm, less than about 22.5 nm, or less than about 11.25 nm in embodiments. The pitch of the fin structures may be one-fourth or one-half of the pitch of the photoresist features in embodiments.

The pair of fin structures may be formed above a first section of a top surface of the semiconductor substrate, and the second spacer material may be above a second section of the top surface of the semiconductor substrate. The first section of the top surface of the semiconductor substrate may be substantially coplanar with the second section of the top surface of the semiconductor substrate.

The method 600 may incorporate leaving a portion of the second spacer material in a completed semiconductor device 614. In these or other embodiments, the method may include forming a layer above the pair of fin structures while retaining most of the second spacer material initially adjacent to the semiconductor material.

In the preceding description, for the purposes of explanation, numerous details have been set forth to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a fin" includes a plurality of such fins, and reference to "the layer" includes reference to one or more layers and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A method of semiconductor patterning comprising:
   forming a hardmask feature on a semiconductor substrate;
   forming a first trench bordered by a first spacer material formed conformally around the hardmask feature;
   removing substantially all of the hardmask feature;
   forming a second trench bordered by a second spacer material formed conformally around the first spacer material after removing substantially all of the hardmask feature;
   filling the second trench with a semiconductor material; and exposing an upper sidewall of the semiconductor material by removing a first portion of the second spacer material adjacent to the semiconductor material, wherein:
   the upper sidewall of the semiconductor material does not comprise the entire sidewall of the semiconductor material, and
   removing the first portion of the second spacer material comprises retaining a second portion of the second spacer material having a height more than half the height of the semiconductor material upon completion of the removing step.

2. The method of claim 1, wherein the second trench has a width and the width is less than or equal to 10 nm.

3. The method of claim 1, wherein the method further comprises:
   forming a pair of trenches bordered by the second spacer material; and
   filling the pair of trenches with the semiconductor material, wherein the pair of trenches has a pitch of less than or equal to 45 nm.

4. The method of claim 1, wherein the method further comprises:
   forming a pair of trenches bordered by the second spacer material; and
   filling the pair of trenches with the semiconductor material, wherein the pair of trenches has a pitch of less than or equal to 22.5 nm.

5. The method of claim 1, wherein forming the second spacer material comprises forming the second spacer material above a buffer layer, wherein the buffer layer comprises a III-V compound.

6. The method of claim 1, wherein the semiconductor material is grown epitaxially after forming the second trench.

7. The method of claim 1, wherein the first spacer material differs from the second spacer material.

8. The method of claim 7, wherein the method further comprises removing substantially all of the first spacer material.

9. The method of claim 1, wherein the method further comprises removing a portion of the first spacer material adjacent to the second spacer material, wherein the portion of the first spacer material is less than all of the first spacer material initially adjacent to the second spacer material.

10. The method of claim 1, wherein forming the first trench bordered by the first spacer material comprises:
    forming the first spacer material conformally around the hardmask feature, wherein:
    the hardmask feature has a first width,
    the first trench has a second width, and
    the first width is essentially equal to the second width.

11. The method of claim 1, wherein the second trench has a height, wherein the height is greater than or equal to 150 nm.

12. The method of claim 1, wherein:
    forming the second trench comprises forming the second spacer material above a first section of a top surface of a semiconductor substrate; and
    filling the second trench comprises growing semiconductor material on a second section of the top surface of the semiconductor substrate, wherein the first section is substantially coplanar with the second section.

13. A method of semiconductor patterning comprising:
    forming hardmask features on a semiconductor substrate;
    forming a first pair of trenches bordered by a first spacer material formed conformally around the hardmask features;
    forming a second pair of trenches bordered by a second spacer material formed conformally around the first spacer material, wherein the first spacer material differs from the second spacer material;
    removing substantially all of the first spacer material;
    filling the second pair of trenches with a semiconductor material;
    forming a pair of fin structures comprising the semiconductor material in the second pair of trenches, wherein:
    the pair of fin structures has a pitch of less than 22.5 nm,
    the pair of fin structures is formed above a first section of a top surface of the semiconductor substrate,
    the second spacer material is above a second section of the top surface of the semiconductor substrate, and
    the first section of the top surface of the semiconductor substrate is substantially coplanar with the second section of the top surface of the semiconductor substrate; and
    exposing an upper sidewall of the semiconductor material by removing a portion of the second spacer material, wherein the upper sidewall of the semiconductor material does not comprise the entire sidewall of the semiconductor material.

14. The method of claim 1, wherein the second trench has a width and the width is less than or equal to 7 nm.

15. The method of claim 1, wherein the sidewall of the semiconductor material is substantially vertical.

16. The method of claim 1, wherein the height of the semiconductor material is greater than or equal to 100 nm.

17. The method of claim 1, wherein the semiconductor material comprises germanium, silicon germanium, or a III-V compound.

18. The method of claim 13, wherein the semiconductor material comprises germanium, silicon germanium, or a III-V compound.

19. The method of claim 13, wherein the first spacer material comprises silicon nitride or silicon oxide.

20. The method of claim 13, wherein the second spacer material comprises silicon nitride or silicon oxide.

* * * * *